(12) United States Patent
Letavic et al.

(10) Patent No.: US 6,642,558 B1
(45) Date of Patent: Nov. 4, 2003

(54) METHOD AND APPARATUS OF TERMINATING A HIGH VOLTAGE SOLID STATE DEVICE

(75) Inventors: Ted Letavic, Putnam Valley, NY (US); Mark Simpson, White Plains, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/531,701

(22) Filed: Mar. 20, 2000

(51) Int. Cl.$^7$ .......................................... H01L 27/148
(52) U.S. Cl. ..................... 257/219; 257/285; 257/657
(58) Field of Search ................................. 257/101, 269, 257/450, 657, 219, 285

(56) References Cited

U.S. PATENT DOCUMENTS

| | | | | |
|---|---|---|---|---|
| 4,559,549 A | * | 12/1985 | Roberts et al. ................ 357/24 |
| 4,573,066 A | * | 2/1986 | Whight .......................... 357/52 |
| 4,648,174 A | * | 3/1987 | Temple et al. ............... 296/578 |
| 4,672,738 A | * | 6/1987 | Stengl et al. .............. 29/576 B |
| 4,809,048 A | * | 2/1989 | Kimata et al. ................. 357/24 |
| 4,927,772 A | * | 5/1990 | Arthur et al. .................... 437/6 |
| 4,982,253 A | * | 1/1991 | Kemmer et al. ............... 357/24 |
| 5,300,448 A | * | 4/1994 | Merchant et al. .............. 437/41 |
| 5,639,676 A | * | 6/1997 | Hshieh et al. .......... 437/40 DM |
| 5,777,373 A | * | 7/1998 | Groenig ....................... 257/495 |
| 5,914,500 A | * | 6/1999 | Bakowski et al. ............. 257/77 |
| 5,932,894 A | * | 8/1999 | Bakowski et al. ............. 257/76 |
| 5,967,795 A | * | 10/1999 | Bakowsky et al. .......... 438/494 |
| 5,994,754 A | * | 11/1999 | Hayashi et al. .............. 257/495 |
| 6,002,159 A | * | 12/1999 | Bakowski et al. ........... 257/493 |
| 6,037,632 A | | 3/2000 | Omura et al. ................ 257/341 |
| 6,096,663 A | * | 8/2000 | Alok et al. ................... 438/931 |
| 6,100,111 A | * | 8/2000 | Konstantinov ................ 438/92 |
| 6,114,212 A | * | 9/2000 | Lee et al. ..................... 438/309 |

FOREIGN PATENT DOCUMENTS

| | | | |
|---|---|---|---|
| DE | 19816448 C | 9/1999 | ........... H01L/29/06 |
| JP | 09268202 | * 9/1994 | |
| WO | WO9953550 | 3/1999 | ........... H01L/29/06 |

* cited by examiner

*Primary Examiner*—Eddie Lee
*Assistant Examiner*—Eugene Lee

(57) ABSTRACT

Termination of a high voltage device is achieved by a plurality of discrete deposits of charge that are deposited in varying volumes and/or spacing laterally along a termination region. The manner in which the volumes and/or spacing varies also varies between different layers of a multiple layer device. In a preferred embodiment, the variations are such that the field strength is substantially constant along any horizontal or vertical cross section of the termination region.

11 Claims, 3 Drawing Sheets

METHOD AND APPARATUS OF TERMINATING A HIGH VOLTAGE SOLID STATE DEVICE

TECHNICAL FIELD

This invention relates to electronics, and more specifically, to an improved technique of terminating a solid state device. The invention has particular application in high voltage termination of charge compensated devices.

BACKGROUND OF THE INVENTION

FIG. 1 shows a side cross sectional view of an exemplary prior art VDMOS device. As indicated therein, P doped regions 109 are repetitive along a top surface 114 and are typically kept at approximately ground voltage during operation of the device. The gate 111 may be operated at a conventional value of, for example, 15 volts.

At the lower surface of the device is the 600 volt terminal 113. As a result of the structure of the device, that voltage appears at point 103 since point 103 is not electrically isolated from the bottom terminal 113 of the device having the 600 volts. In similar devices, the voltage may rise to 1000 V or more.

A region 107 is denoted T for termination, and must drop the 600 volts across the width of the region. In practical devices, T 107 may be on the order of 50 microns.

A top view of the arrangement of FIG. 1 is shown in FIG. 2. The border region 107 is the termination region, which must include some type of structure for dropping the 600 volts across only 50 micrometers. Section 105 represents the active region of the device.

FIG. 3 shows a typical prior art structure for providing termination of such a high voltage device. A set of floating guard rings 302 is used to control the electric field distribution around the device periphery. The number of rings in the structure depends on the voltage rating of the device. For example, 8 rings are used for a 1,000 volt device. A three dimensional computer model enables the optimum ring spacing to be determined so that each ring experiences a similar field intensity as the structure approaches avalanche breakdown. The rings are passivated with polydox, which acts as an electrostatic screen and prevents external ionic charges inverting the lightly doped N- interface to form P- channels between the rings. The polydox is coated with layers of silicon nitride and phosphorous doped oxide, as shown.

The surface area of the termination region of the device represents a source of added cost to the device. Specifically, the termination region is a substantially sized lateral width that must wrap entirely around the periphery of the device. This increase is the cost of the device, and over the large number of chips per wafer, becomes a significant source of wasted cost and space.

In view of the foregoing, there exists a need in the art for an improved technique of terminating high voltage semiconductor devices without utilizing the relatively large amount of surface area.

There also exists a need for a technique of fabricating a termination structure that is easily manufactured, and does not add significant costs to the device manufacturing procedure.

SUMMARY OF THE INVENTION

The above and other problems of the prior art are overcome in accordance with the present invention. A multiple layer solid state device is constructed wherein each layer includes a varying charge profile extending laterally through the termination region, from the edge of the active (drift) region extending laterally towards the edge of the crystal.

The charge profile, as defined herein, represents the density of deposited charge as a specified cross section is traversed. In a preferred embodiment, the charge profile is different in different layers, so that each layer of the multiple layer device includes decreasing charge density as the termination layer is traversed laterally. Moreover, a decreasing charge profile is also exhibited as a vertical cross section is traversed upwardly towards the source region of the device. In a preferred embodiment, the charge profile decreases substantially linearly along any cross section, lateral or vertical, resulting in a substantially uniform value of electric field strength.

A preferred method of making the device comprises depositing volumes of charge along each layer in a multiple layer device, in the termination region. The volume of charge in each deposit (i.e., dot) or the spacing between the deposits may be varied, with such variation being different at different layers. This causes the field strength to remain substantially constant along any horizontal or vertical cross section.

A further understanding will be gained by reference to the accompanying drawings and description.

DETAILED DESCRIPTION OF THE PREFERRED EMBODIMENT

Figure 4:
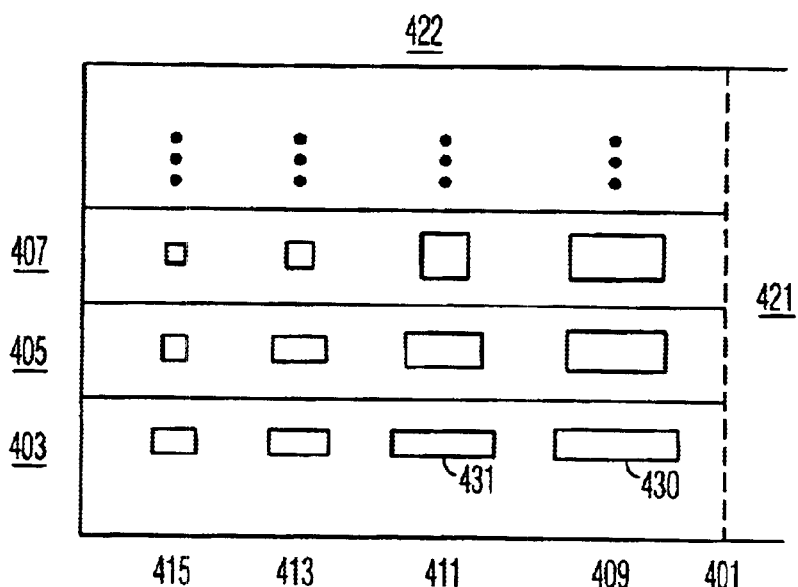
FIG. 4 is a conceptual representation of charge profiles in a semiconductor device, the charge profiles varying in accordance with the present invention.

FIG. 4 shows a conceptual diagram of a cross section through a multi layer device fabricated in accordance with the teachings of the present invention. While layers 403, 405, and 407 are shown, further layers are possible. Region 421 represents the active region of the device, and region 422 represents the termination region of the device. That active region may be constructed to behave electrically as any one or more of a variety of such devices, and is not critical to the present invention. Thus, we only discuss the termination region hereafter.

Layers 403, 405 and 407 each include a charge profile which decreases as the layer is traversed laterally from region 421 to the outside of the device. The charge profile is constructed, in the arrangement of FIG. 4, such that the total charge is a function of lateral or vertical position. Hence, as shown in FIG. 4, more charge is deposited at 409 than at 411, and more charge is deposited at 411 than at 413, and even less charge is deposited at 415. The charge profile includes columns 409, 411, 413, and 415. The successive reduction of total charge with linear dependence on position results in an electric field strength which is substantially constant over a lateral/vertical section.

One way of accomplishing the decreasing charge profile uses the same mask as used for fabrication of the active device. The mask has a portion that extends over the termination region. That extended portion has plural openings which get smaller as one moves away from the active region. Thus, the discrete deposits of charge (i.e., charge dots) diminish in size, as the distance from the active region becomes greater, resulting in a substantially constant electric field.

Additionally, a similar decrease in charge is encountered as a vertical cross section is traversed. Specifically, looking only at column 409 of FIG. 4, as one traverses upward from row 403 to 405 to 407, less charge is deposited with each discrete deposit. The size of the openings in the mask used for each layer may vary, as depicted in FIG. 4.

The small rectangles (e.g., rectangles 430, 431) represent a three by four matrix of discrete deposits of charge, each of which has a different volume of charge contained therein. A typical geometry for such openings may range from approximately 2.5 to 40 microns squared.

The electric field strength at any position within the termination region can be calculated from the spatial variation of charge. Alternatively, a desired electric field strength can be realized by judicious design of the charge profile. The lateral charge at any point in the termination region to can be obtained by summing the contribution from each discrete charge region, subjected to a specified thermal anneal or drive. It is well known to those of skill in the art how to calculate a charge profile for a desired field strength, and how to calculate the field strength from the desired charge profile.

Figure 1:
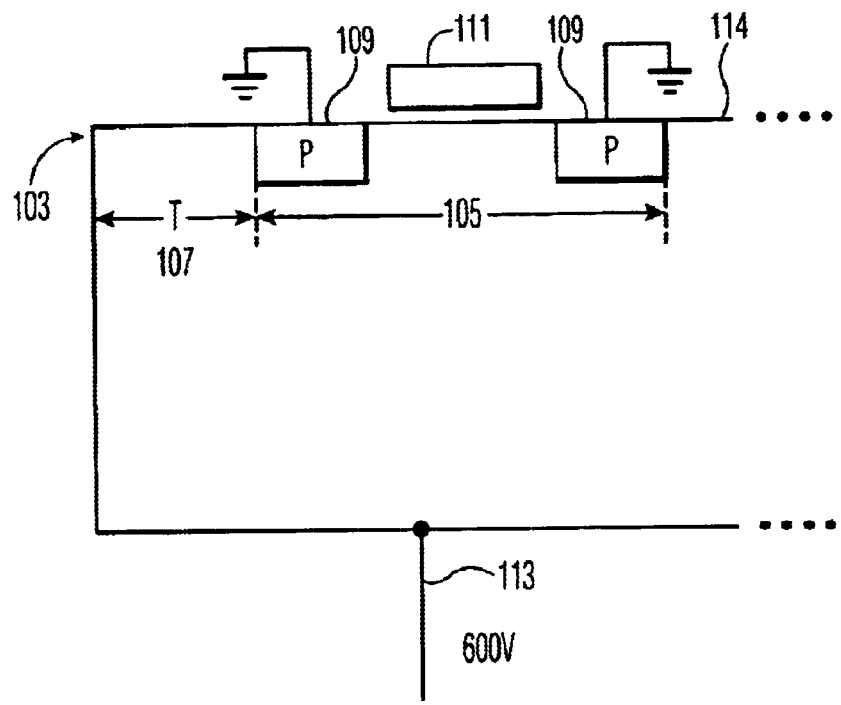
FIG. 1 is a cross sectional view of a semiconductor device, depicting the need for termination.
Figure 2:
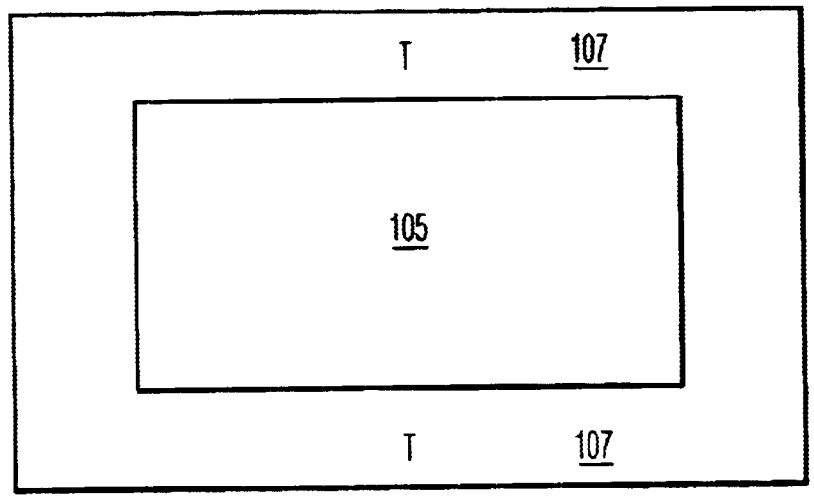
FIG. 2 is a top view of the arrangement of FIG. 1.
Figure 3:
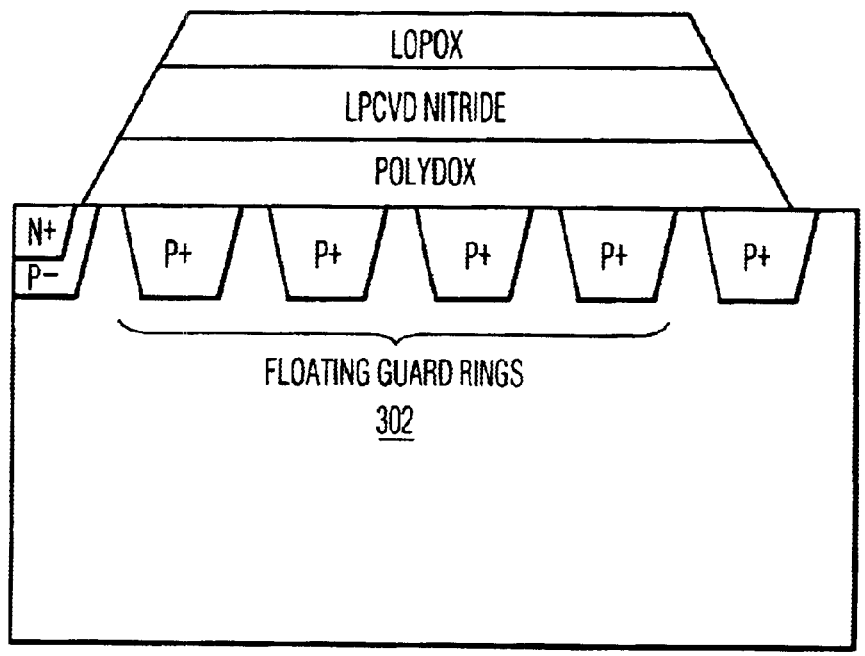
FIG. 3 shows a prior art termination technique utilizing several floating P rings.

Moreover, from FIG. 1 it can be seen that the approximately 600 volts in the exemplary embodiment used herein must also be dropped from the bottom to the surface of the device. The same procedure is utilized upwardly along any column, in order to drop 600 volts across N layers, for devices of N layers deep.

Notably, the invention may be fabricated in a convenient manner for multi layer devices. Specifically, in such multi layer devices the layers are each fabricated separately using a particular mask. The same masks can be utilized to lay down the termination region, with holes of varying size allowing for different amounts of charge. Notably, the mask for each layer would be different, since the openings in the mask that allow for the deposit of charge in the termination region are different. Thus, it is possible to have N different masks, one for each layer. The portion of the mask that corresponds to the active region may be the same for each mask, and the portion that corresponds to the termination region is different for each mask, in order to vary the profile.

Figure 5:
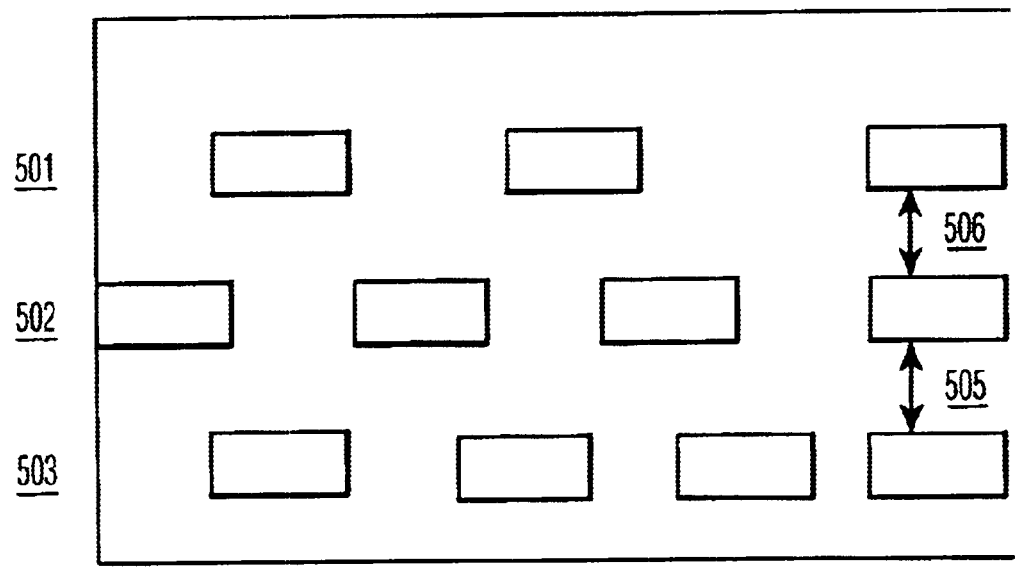
FIG. 5 is an alternative embodiment of the present invention.

FIG. 5 shows a slightly different embodiment for accomplishing a similar objective as FIG. 4. Specifically, in FIG. 5, the size of the discrete charge deposits is similar to each other. However, the distance between such discrete deposits varies as the termination region is laterally traversed. Moreover, the same varying spacing can be found as a vertical cross section is traversed. For example, distance 505 would be slightly less than distance 506. Accordingly, the same substantially constant electric field can be implemented by depositing the discrete charge deposits in equal amounts but further and further apart, as the cross section is traversed, rather than depositing the charge dots in less and less quantity at a fixed distance. Of course, a combination approach may be used as well, where the volume of charge in each deposit and the spacing are varied.

In the preferred embodiment, the charge should be deposited in a manner that decreases with distance from the active (drift) region in a substantially linear manner. This causes a substantially constant electric field strength as one moves away from the active region. That means that the charge in each dot should decrease linearly with distance from the active region.

While the above describes a preferred embodiment of the invention, various modifications and additions will be apparent to those of skill in the art.

What is claimed:

1. A solid state device including a plurality of layers, each layer including an active region and a termination region, at least two layers including termination regions that comprise a varying charge profile extending from the active region, laterally through the termination region towards the edge of said termination region.

2. The device of claim 1 wherein all of said layers include a varying charge profile.

3. The device of claim 1 wherein the varying charge profile of each layer is different from said varying charge profile for other layers.

4. The device of claim 3 wherein said varying charge profile of each layer is different from said varying charge profile for other layers.

5. The device of claim 4 wherein said varying charge profile on at least one layer comprises discrete deposits of charge that vary in total volume.

6. The device of claim 4 wherein said varying charge on each layer comprises discrete deposits of charge that vary in spacing from one another.

7. The device of claim 4 wherein said charge profile on each layer varies substantially linearly with distance away from said active region.

8. The device of claim 4 wherein charge varies along a vertical cross section through multiple layers of said termination region at a fixed distance from said active region in a substantially linear manner.

9. The device of claim 7 wherein charge varies along a vertical cross section through multiple layers of said termination region at a fixed distance from said active region in a substantially linear manner.

10. A solid state device having plural epitaxial layers, each epitaxial layer including a termination region, the termination region being doped with a plurality of p-dots of charge which vary along the termination region in their volume or spacing, the volume and spacing of said charge dots being different on at least two different layers of said device.

11. The solid state device of claim 10 wherein the volume and spacing of the dots on each layer is such that a substantially constant field strength is achieved moving away from the active region along any layer or moving upwards through the layers along any vertical cross section.

* * * * *